United States Patent
Kobayashi et al.

(10) Patent No.: US 10,522,673 B2
(45) Date of Patent: Dec. 31, 2019

(54) SEMICONDUCTOR DEVICE HAVING A SCHOTTKY BARRIER DIODE

(71) Applicant: FUJI ELECTRIC CO., LTD., Kawasaki (JP)

(72) Inventors: Yusuke Kobayashi, Tsukuba (JP); Manabu Takei, Tsukuba (JP); Shinsuke Harada, Tsukuba (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 0 days.

(21) Appl. No.: 16/117,592

(22) Filed: Aug. 30, 2018

(65) Prior Publication Data

US 2019/0109228 A1    Apr. 11, 2019

(30) Foreign Application Priority Data

Oct. 5, 2017 (JP) .................. 2017-195481

(51) Int. Cl.

| H01L 29/78 | (2006.01) |
|---|---|
| H01L 29/06 | (2006.01) |
| H01L 29/10 | (2006.01) |
| H01L 27/06 | (2006.01) |
| H01L 29/16 | (2006.01) |

(52) U.S. Cl.
CPC ...... *H01L 29/7806* (2013.01); *H01L 27/0629* (2013.01); *H01L 29/0615* (2013.01); *H01L 29/0696* (2013.01); *H01L 29/1045* (2013.01); *H01L 29/7813* (2013.01); *H01L 29/1608* (2013.01)

(58) Field of Classification Search
CPC ............ H01L 29/7806; H01L 29/0615; H01L 29/0696; H01L 29/1045; H01L 29/7813; H01L 27/0629
See application file for complete search history.

(56) References Cited

U.S. PATENT DOCUMENTS

| 5,426,067 A * | 6/1995 | Ogawa .............. H01L 29/66272 438/359 |
| 7,745,878 B2 * | 6/2010 | Bhalla ................... H01L 29/407 257/330 |
| 7,982,265 B2 * | 7/2011 | Challa ................. H01L 21/3065 257/341 |

(Continued)

FOREIGN PATENT DOCUMENTS

| JP | 2005-354037 A | 12/2005 |
| JP | 2008-536316 A | 9/2008 |

*Primary Examiner* — Ida M Soward

(57) ABSTRACT

Plural trenches are provided in a semiconductor substrate. First $p^+$-type regions underlie bottoms of the trenches. A MOS gate is embedded in first trenches of the trenches and one unit cell of a trench-gate-type MOSFET is configured. One unit cell of a trench-type SBD is constituted by a Schottky junction formed by an n-type current spreading region and a conductive layer embedded in a second trench of the trenches. Between second trenches in which the trench-type SBD is embedded, at least two of the first trenches in which a MOS gate is embedded are disposed. A sum of widths of all first $p^+$-type regions disposed in a MOS cell region C' that is substantially half of a region between the adjacent second trenches is in a range of about 2 μm to 8 μm.

7 Claims, 12 Drawing Sheets

(56) References Cited

U.S. PATENT DOCUMENTS

| | | | |
|---|---|---|---|
| 8,193,584 B2* | 6/2012 | Mauder | H01L 29/407 257/341 |
| 8,441,105 B2* | 5/2013 | Sato | H01L 21/6836 257/620 |
| 8,519,452 B2* | 8/2013 | Malhan | H01L 29/0661 257/280 |
| 8,610,235 B2* | 12/2013 | Calafut | H01L 27/06 257/471 |
| 8,680,608 B2* | 3/2014 | Saito | H01L 29/0634 257/329 |
| 8,928,071 B2* | 1/2015 | Shirai | H01L 29/475 257/330 |
| 9,059,284 B2* | 6/2015 | Saito | H01L 29/7839 |
| 9,818,860 B2* | 11/2017 | Takeuchi | H01L 21/8213 |
| 9,859,400 B2* | 1/2018 | Darwish | H01L 29/7395 |
| 10,141,410 B2* | 11/2018 | Shimizu | H01L 21/02529 |
| 10,283,634 B2* | 5/2019 | Haeberlen | H01L 29/0834 |
| 2005/0258479 A1 | 11/2005 | Ono et al. | |
| 2007/0262410 A1* | 11/2007 | Ono | H01L 27/0727 257/499 |
| 2009/0256197 A1* | 10/2009 | Nakazawa | H01L 29/0878 257/334 |
| 2010/0032752 A1* | 2/2010 | Hozumi | H01L 29/0634 257/331 |
| 2014/0169045 A1* | 6/2014 | Ueno | H01L 29/7393 363/37 |
| 2014/0175508 A1* | 6/2014 | Suzuki | H01L 29/872 257/140 |
| 2014/0203355 A1 | 7/2014 | Kocon et al. | |
| 2015/0035048 A1* | 2/2015 | Weber | H01L 29/7811 257/329 |
| 2016/0079376 A1* | 3/2016 | Hirler | H01L 29/407 257/328 |

* cited by examiner

SEMICONDUCTOR DEVICE HAVING A SCHOTTKY BARRIER DIODE

CROSS REFERENCE TO RELATED APPLICATIONS

This application is based upon and claims the benefit of priority of the prior Japanese Patent Application No. 2017-195481, filed on Oct. 5, 2017, the entire contents of which are incorporated herein by reference.

BACKGROUND

1. Field

Embodiments of the invention relate to a semiconductor device.

2. Description of Related Art

Conventionally, reduction of the ON resistance, suppression of forward characteristics degradation, and reduction of reverse recovery loss are demanded of a power semiconductor device that uses a semiconductor material (hereinafter, wide bandgap semiconductor material) having a bandgap that is wider than that of silicon (Si). To realized reduced ON resistance, for example, in a vertical metal oxide semiconductor field effect transistor (MOSFET), a trench gate structure is adopted that facilitates structurally low ON resistance characteristics as compared to a planar gate structure in which a MOS gate is disposed in a flat plate-like shape on a front surface of a semiconductor chip.

A trench gate structure is a MOS gate structure embedded in a MOS gate in a trench formed at a front surface of a semiconductor chip and by reducing cell pitch (a repeat width of a unit cell (constituent unit of an element)), the ON resistance may be reduced. Suppression of forward characteristics degradation and reduction of reverse recovery loss may be realized by building a Schottky barrier diode (SBD) into a single semiconductor substrate (semiconductor chip) in which a MOSFET is provided. In a MOSFET having a SBD built into the same semiconductor substrate as the MOSFET, the cell pitch of the MOSFET increases when the SBD is constituted by a conductive layer disposed in a flat plate-like arrangement on the semiconductor substrate.

When the cell pitch of the MOSFET is large, the ON resistance increases compared to a MOSFET without a built-in SBD. Therefore, a trench-type SBD built into a single semiconductor substrate in which the MOSFET is provided has been proposed. The built-in trench-type SBD extends in a direction (vertical direction) orthogonal to a front surface of the semiconductor substrate. In the MOSFET having the built-in trench-type SBD, a width along the lateral direction of the SBD may be reduced as compared to a case in which a plate-like SBD extending in a direction (lateral direction) parallel to the front surface of the semiconductor substrate is built-in. Therefore, even when the cell pitch of the MOSFET is reduced to about 3.2 μm, the SBD may be built-in without increasing the ON resistance.

A conventional trench-gate-type MOSFET having a trench-type SBD built into the same semiconductor substrate as the trench-gate-type MOSFET will be described taking, as an example, a case in which silicon carbide (SiC) is used as the wide bandgap semiconductor material. FIG. 11 is a cross-sectional view of a structure of a conventional semiconductor device. FIG. 12 is a plan view of a layout as viewed from a front surface of a semiconductor substrate depicted in FIG. 11. The trench-gate-type MOSFET depicted in FIG. 11 includes at a front surface side of a silicon carbide substrate 110, a trench (hereinafter, gate trench) 107 in which a MOS gate of a trench-gate-type MOSFET 121 is embedded, and a trench 131 in which a trench-type SBD 122 is embedded.

The silicon carbide substrate 110 is a silicon carbide epitaxial substrate in which silicon carbide layers constituting an $n^-$-type drift region 102 and a p-type base region 104 are sequentially formed by epitaxial growth on an $n^+$-type starting substrate 101 containing silicon carbide. The gate trench 107 and the trench 131 in which the trench-type SBD 122 is embedded are disposed alternating along a direction parallel to the front surface of the silicon carbide substrate 11 (refer to FIG. 12). In other words, between adjacent unit cells of the trench-gate-type MOSFET 121, i.e., between adjacent gate trenches 107, one unit cell of the trench-type SBD 122 is built-in.

The unit cell of the trench-gate-type MOSFET 121 is constituted by a MOS gate in one gate trench 107 and adjacent mesa regions that sandwich the MOS gate. The mesa region is a part (silicon part) of the silicon carbide substrate 110 between the adjacent gate trenches 107. The trench-type SBD 122 includes the trench 131 between the gate trenches 107 and a conductive layer 132 embedded in the trench 131, and is constituted by a Schottky junction 133 of an n-type current spreading region 103 and the conductive layer 132 formed along a side wall of the trench 131.

Reference numeral 106 represents $p^+$-type regions respectively underlying bottoms of the trenches 107, 131 and electrically connected to a source electrode 112, at a part not depicted. In FIG. 12, a gate electrode 109 embedded in the gate trench 107 and the conductive layer 132 embedded in the trench 131 are indicated by different hatching. Further, in FIG. 12, to clearly depict a layout of the trenches 107, 131, a gate insulating film 108 and other parts in the mesa region are not depicted. Reference numerals 105, 111, and 113 are an $n^+$-type source region, an interlayer insulating film, and a drain electrode, respectively.

As a trench-gate-type MOSFET in which a trench-type SBD is built into the same semiconductor substrate as the trench-gate-type MOSFET, a device has been proposed in which between (mesa region) gate trenches disposed in a striped layout having a uniform pitch, a trench is formed opposing the gate trench across a p-type base region, and a Schottky junction of an n-type epitaxial layer and a metal layer at a bottom of the trench is formed (for example, refer to Japanese Laid-Open Patent Publication No. 2005-354037 (paragraphs 0029, 0039, FIG. 2). In Japanese Laid-Open Patent Publication No. 2005-354037, by forming the trench-type SBD between the gate trenches, increases in the mathematical area of the MOSFET and increases in the ON resistance of the MOSFET are prevented without increasing the cell pitch of the MOSFET.

Further, as another trench-gate-type MOSFET in which a trench-type SBD is built into the same semiconductor substrate as the trench-type SBD, a device has been proposed in which between (mesa region) gate trenches, a Schottky junction of a conductive layer and an $n^-$-type epitaxial layer is formed near a bottom of a trench that has a V-shaped cross-sectional shape, and that penetrates an $n^+$-type source region and reaches an $n^-$-type epitaxial layer (refer to Published Japanese-Translation of PCT Application, Publication No. 2008-536316 (paragraphs 0016, 0026, 0064, FIG. 1)). In Published Japanese-Translation of PCT Application, Publication No. 2008-536316, at an inclined side wall of the trench, a mathematical area of contact of the conductive layer and the n+-type source region is enlarged, source contact resistance (ON resistance) is reduced, and the Schottky junction of the n−-type epitaxial layer and the conductive layer is formed near the bottom of the trench.

SUMMARY

According to an embodiment of the present invention, a semiconductor device includes a semiconductor substrate made of a semiconductor material having a bandgap that is wider than that of silicon; a first semiconductor layer of a first conductivity type and containing a semiconductor material having a bandgap that is wider than that of silicon, the first semiconductor layer provided on a front surface of the semiconductor substrate; a second semiconductor layer of a second conductivity type and containing a semiconductor material having a bandgap that is wider than that of silicon, the second semiconductor layer provided on a first side of the first semiconductor layer, opposite a second side of the first semiconductor layer facing the semiconductor substrate; a first semiconductor region of the first conductivity type, selectively provided in the second semiconductor layer; a plurality of trenches penetrating the first semiconductor region and the second semiconductor layer, and reaching the first semiconductor layer; a gate electrode provided on a gate insulating film in first trenches of the plurality of trenches; a conductive layer in second trenches of the plurality of trenches, different from the first trenches; second semiconductor regions of the second conductivity type selectively provided in the first semiconductor layer, separated from the second semiconductor layer and respectively opposing the first trenches in a depth direction; third semiconductor regions of the second conductivity type selectively provided in the first semiconductor layer, separated from the second semiconductor layer and respectively underlying bottoms of the second trenches; a first electrode electrically connected with the second semiconductor layer, the first semiconductor region, the second semiconductor region, the third semiconductor region, and the conductive layer; a second electrode provided at a rear surface of the semiconductor substrate; and a Schottky barrier diode constituted by a Schottky junction of the conductive layer and the first semiconductor layer. At least two of the first trenches are provided between a pair of the second trenches that are adjacent to each other.

In the embodiment, between the pair of the second trenches, a first region is from an end of a first second-semiconductor-region of the second semiconductor regions and nearest a first second-trench of the pair of the second trenches, to an end of a second second-semiconductor-region of the second semiconductor regions and nearest a second second-trench of the pair of the second trenches. The end of the first second-semiconductor-region is an end nearest the first second-trench while the end of the second second-semiconductor-region is an end nearest the second second-trench. A second region between the pair of the second trenches has a width that is a half of a width of the first region, and at least one of the first trenches is disposed in the second region.

In the embodiment, a sum of the width of all the second semiconductor regions disposed in second region is in a range from 2 μm to 8 μm.

In the embodiment, the second semiconductor regions underlie bottoms of the first trenches.

In the embodiment, the second semiconductor regions are disposed separated from the first trenches.

In the embodiment, the semiconductor device further includes fourth semiconductor regions of the second conductivity type provided between the first trenches and the second semiconductor regions, separated from the second semiconductor regions and respectively underlying bottoms of the first trenches.

In the embodiment, the plurality of trenches is disposed in a striped layout extending along a direction parallel to the front surface of the semiconductor substrate.

Objects, features, and advantages of the present invention are specifically set forth in or will become apparent from the following detailed description of the invention when read in conjunction with the accompanying drawings.

DESCRIPTION OF EMBODIMENTS

Figure 1:
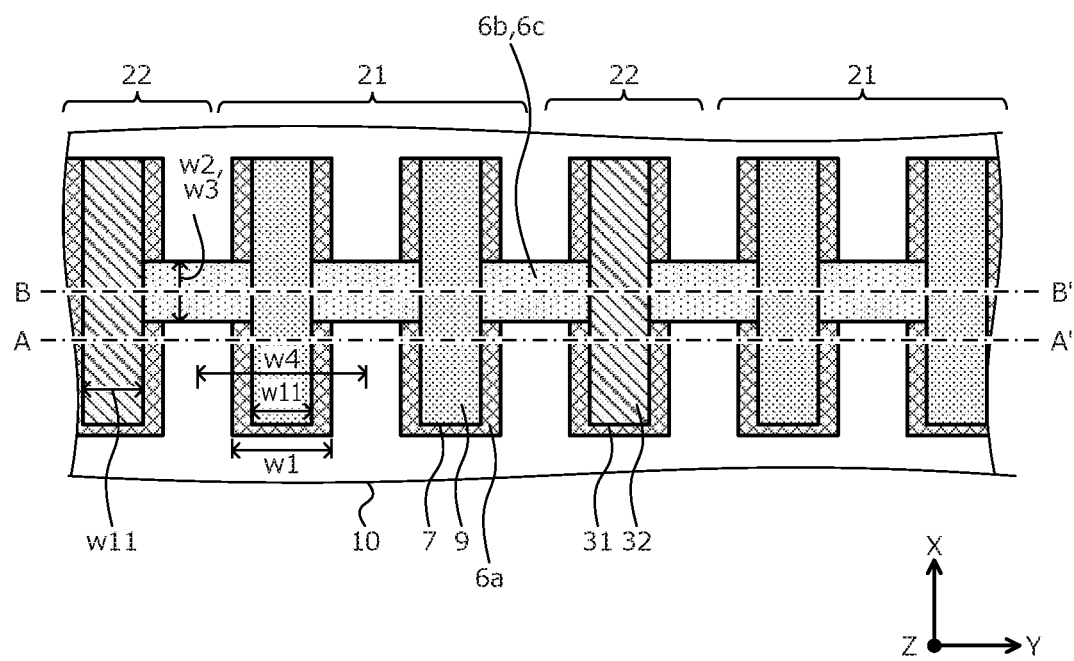
FIG. 1 is a plan diagram depicting a planar layout of a semiconductor device according to a first embodiment.

First, problems associated with the conventional techniques will be described. As a result earnest research by the inventors, in the conventional semiconductor device (refer to FIG. 11), when the cell pitch of the trench-gate-type MOSFET 121 is reduced to be less than 3.2 μm, the ON resistance was found to increase as compared to a trench-gate-type MOSFET without a built-in SBD.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

The semiconductor device according to a first embodiment is configured using a semiconductor material (wide bandgap semiconductor material) that has a wider bandgap than that of silicon (Si). A structure of the semiconductor device according to the first embodiment will be described taking, as an example, a case in which, for example, silicon carbide (SiC) is used as the wide bandgap semiconductor material. FIG. 1 is a plan diagram depicting a planar layout of the semiconductor device according to the first embodiment. A planar layout is an arrangement configuration and planar shape of parts as viewed from a front surface side of a semiconductor substrate 10. FIG. 1 depicts a layout of first and second trenches 7, 31 as viewed from the front surface side of the semiconductor substrate (semiconductor chip) 10.

Figure 2:
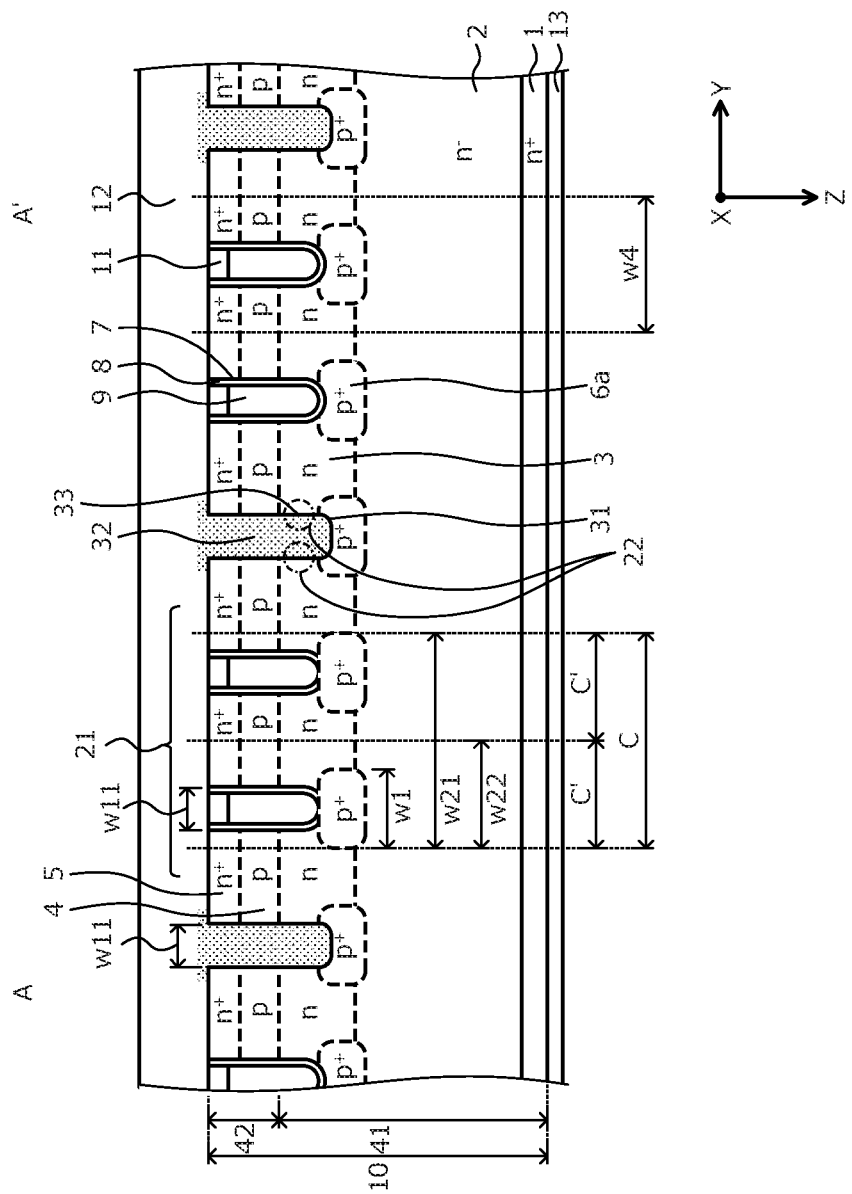
FIG. 2 is a cross-sectional view along cutting line A-A' depicted in FIG. 1.
Figure 3:
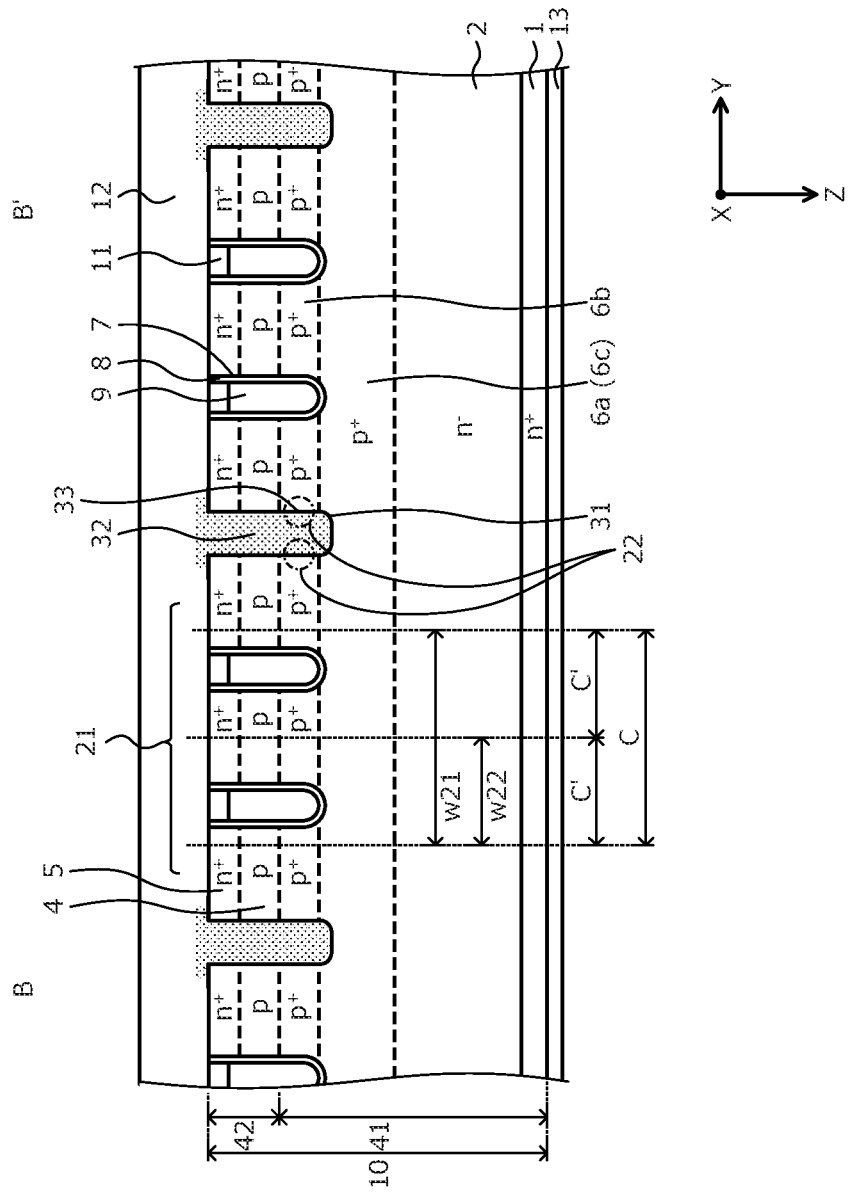
FIG. 3 is a cross-sectional view at cutting line B-B' depicted in FIG. 1.

In FIG. 1, to clearly depict the layout of the first and second trenches 7, 31, a gate insulating film 8 and parts in a mesa region are not depicted. Further, in FIG. 1, the gate electrode 9 embedded in the first trench 7 and a conductive layer 32 embedded in the second trench 31 are indicated by different hatching (similarly in FIG. 5). FIG. 2 is a cross-sectional view along cutting line A-A' depicted in FIG. 1. FIG. 3 is a cross-sectional view at cutting line B-B' depicted in FIG. 1. FIGS. 1 to 3 depict only some of the unit cells (constituent units of an element) disposed in an active region and an edge termination region is not depicted (similarly in FIGS. 4 to 9). In FIGS. 2, 3, only the conductive layer 32 is depicted by hatching (similarly in FIGS. 4, 6 to 8).

The active region is a region through which current flows when the semiconductor device is in a state. The edge termination region is a region between the active region and a side surface of the semiconductor substrate 10, and is a region that mitigates electric field at a substrate front surface (a front surface of the semiconductor substrate 10) side of an $n^-$-type drift region 2 and sustains a breakdown voltage. In the edge termination region, for example, a general breakdown voltage structure such as a guard ring, a field plate, RESURF, etc. is disposed. The breakdown voltage is a voltage limit at which no damage or errant operation of the semiconductor device occurs. The mesa region is a part (silicon part) of the semiconductor substrate 10 sandwiched between adjacent first and second trenches 7, 31.

The semiconductor device according to the first embodiment and depicted in FIG. 1 is a trench-gate-type MOSFET 21 provided in the semiconductor substrate 10 that contains silicon carbide and has a trench-type SBD 22 built therein. The trench-gate-type MOSFET 21 includes on the front surface side of the semiconductor substrate 10, a MOS gate that is constituted by constituted by a p-type base region 4, an $n^+$-type source region (first semiconductor region) 5, a $p^{+\pm}$-type contact region (not depicted), the first trench (gate trench) 7, the gate insulating film 8, and the gate electrode 9. The trench-type SBD 22 is constituted by the second trench 31, the conductive layer 32 and an n-type current spreading region 3 sequentially provided at the front surface of the semiconductor substrate 10. The trench-type SBD 22 has a function of preventing degradation of a parasitic diode (body diode) formed in the trench-gate-type MOSFET 21.

In particular, the semiconductor substrate 10 is a silicon carbide epitaxial substrate in which silicon carbide layers (first and second semiconductor layers) 41, 42 constituting the $n^-$-type drift region 2 and the p-type base region 4 are formed sequentially by epitaxial growth on an $n^+$-type starting substrate 1 that contains silicon carbide. In a surface layer on a source side (side facing toward a source electrode (first electrode) 12) of the $n^-$-type silicon carbide layer 41, an n-type region (hereinafter, an n-type current spreading region) 3 is provided so as to be in contact with a p-type silicon carbide layer 42 (the p-type base region 4). The n-type current spreading region 3 is a so-called current spreading layer (CSL) that reduces carrier spread resistance.

The n-type current spreading region 3 is provided uniformly along a direction parallel to the substrate front surface. The n-type current spreading region 3 reaches from an interface with the p-type base region 4, a deep position closer to a drain (drain electrode (second electrode) 13) than are bottoms of the first and the second trenches 7, 31 described hereinafter. A part of the $n^-$-type silicon carbide layer 41 other than the n-type current spreading region 3 is the $n^-$-type drift region 2. The n-type current spreading region 3 is exposed at inner walls of the first and the second trenches 7, 31, between the $n^-$-type drift region 2 and the p-type base region 4. The n-type current spreading region 3 may be omitted.

In the n-type current spreading region 3 (in the $n^-$-type drift region 2 when the n-type current spreading region 3 is not provided), first and second $p^+$-type regions 6a, 6b are selectively provided. The first $p^+$-type region (second and third semiconductor regions) 6a is provided in plural separated from each other and each of the first $p^+$-type regions 6a respectively opposes and underlies in a depth direction Z, the bottoms of the first and the second trenches 7, 31, which differ from each other (refer to FIGS. 2, 3). Further, the first $p^+$-type region 6a is disposed separated from the p-type base region 4, at a deep position closer to the drain than is the interface of the p-type base region 4 and the n-type current spreading region 3.

The first $p^+$-type region 6a is electrically connected to the source electrode 12 at a part not depicted. The first $p^+$-type region 6a has a width (a width along a second direction Y described hereinafter) w1 that, for example, may be equal to a width (width along the second direction Y) w11 of the first and the second trenches 7, 31, or wider than the width w11 of the first and the second trenches 7, 31. An edge of the first $p^+$-type regions 6a toward the drain may terminate in the n-type current spreading region 3, may reach an interface of the n-type current spreading region 3 and the $n^-$-type drift region 2, or may terminate in the $n^-$-type drift region 2.

Further, the first $p^+$-type regions 6a may underlie the bottoms and bottom corner parts of the first and the second trenches 7, 31, spanning from the bottoms to the bottom corner parts of the first and the second trenches 7, 31. The bottoms of the first and the second trenches 7, 31 is a face of the inner walls of the first and the second trenches 7, 31, positioned deepest from the front surface of the semiconductor substrate 10 and substantially parallel to the substrate front surface (the front surface of the semiconductor substrate 10). The bottom corner parts of the first and the second trenches 7, 31 are borders of the bottoms and side walls of the first and the second trenches 7, 31.

The first $p^+$-type regions 6a are disposed in a striped layout extending in a direction parallel to the front surface of the semiconductor substrate 10 (refer to FIG. 1). Hereinafter, a direction in which the first $p^+$-type regions 6a extend in a striped shape parallel to the front surface of the semiconductor substrate 10 is assumed as a first direction X (refer to FIG. 2). Adjacent first $p^+$-type regions 6a are partially in contact and connected to each other. Hereinafter, a connecting part ($p^+$-type region) of adjacent first $p^+$-type regions 6a is assumed as a $p^+$-type connecting region 6c. The $p^+$-type connecting region 6c has a thickness and a depth from the substrate front surface, for example, equal to the depth and thickness of the first $p^+$-type regions 6a.

The $p^+$-type connecting region 6c is disposed in a striped layout extending in a direction parallel to the front surface of the semiconductor substrate 10 and orthogonal to the first direction X (lateral direction in FIGS. 2, 3 (the second direction)) Y (refer to FIG. 1). In other words, at a depth position underlying the bottoms of the first and the second trenches 7, 31, the p$^+$-type regions are disposed in a grid-like layout constituted by the first p$^+$-type regions 6a and the p$^+$-type connecting region 6c thereof, as viewed from the front surface side of the semiconductor substrate 10. FIG. 1 depicts only one linear part of the p$^+$-type connecting region 6c, constituting a strip along the second direction Y.

The second p$^+$-type region 6b is provided between the p$^+$-type connecting region 6c and the p-type silicon carbide layer 42 (the p-type base region 4) and is in contact with both the p$^+$-type connecting region 6c and the p-type silicon carbide layer 42 (the p-type base region 4). The second p$^+$-type region 6b is disposed in a striped layout extending along the second direction Y (refer to FIG. 1). A width (width along the first direction X) w2 of a shorter dimension of the second p$^+$-type region 6b may be substantially equal a width (width along the first direction X) w3 of a shorter dimension of the p$^+$-type connecting region 6c.

The first and the second p$^+$-type regions 6a, 6b have a function of depleting when the trench-gate-type MOSFET 21 is OFF and mitigating electric field applied to the bottoms of the first and the second trenches 7, 31. Provision of the first and the second p$^+$-type regions 6a, 6b enables the cell pitch (repeat width of the unit cell) of the trench-gate-type MOSFET 21 and the ON resistance to be reduced while the breakdown voltage is maintained.

In the p-type silicon carbide layer 42, the first and the second trenches 7, 31 are provided penetrating in the depth direction Z, the p-type silicon carbide layer 42 from the front surface of the semiconductor substrate 10 (surface of the p-type silicon carbide layer 42) and reaching the n-type current spreading region 3. The first and the second trenches 7, 31 terminate in respectively different the first p$^+$-type regions 6a. In addition, the first and the second trenches 7, 31, at a part where the second p$^+$-type region 6b is disposed, penetrate the p-type silicon carbide layer 42 and the second p$^+$-type region 6b in the depth direction Z and reach the p$^+$-type connecting region 6c of the first p$^+$-type region 6a. The depth direction Z is a direction from the front surface of the semiconductor substrate 10 toward a rear surface thereof.

The bottom corner parts of the first and the second trenches 7, 31 may have a circular arc shape that is curved at a predetermined curvature. The smaller the curvature of the bottom corner parts of the first and the second trenches 7, 31 is, the greater is the occupation rate of bottom corner parts at the drain side of the first and the second trenches 7, 31 and the bottoms of the first and the second trenches 7, 31 approach a point (vertex). The side walls of the first and the second trenches 7, 31 are faces of the inner walls of the first and the second trenches 7, 31 connected to the substrate front surface (the front surface of the semiconductor substrate 10) and substantially orthogonal to the substrate front surface.

Further, as viewed from the front surface of the semiconductor substrate 10, the first and the second trenches 7, 31 are disposed in a striped layout extending along the first direction X so as to overlap the first p$^+$-type regions 6a having a striped shape (refer to FIG. 1).

In the first trench (gate trench) 7, the gate insulating film 8 is provided along the inner wall of the first trench 7. The gate electrode 9 such as a poly-silicon (poly-Si) layer is provided on the gate insulating film 8 so as to be embedded in the first trench 7, whereby the MOS gate of the trench-gate-type MOSFET 21 is configured. An end of the gate electrode 9 toward the drain reaches a deep position closer to the drain than is the interface of the p-type base region 4 and the n-type current spreading region 3.

The MOS gate in a single first trench 7 and adjacent mesa regions sandwiching the MOS gate constitute one unit cell of the trench-gate-type MOSFET 21. The cell pitch of the trench-gate-type MOSFET 21 and the cell pitch of the trench-type SBD 22 adjacent to the trench-gate-type MOSFET 21 are, for example, less than 4.0 μm. The cell pitch is a distance w4 between centers of adjacent mesa regions sandwiching a single trench (the first trench 7 or the second trench 31).

In the second trench 31, for example, the conductive layer 32 that is a metal layer constituted by a metal material such as titanium (Ti), nickel (Ni), tungsten (W), molybdenum (Mo), etc., or a poly-silicon (poly-Si) layer is embedded. The conductive layer 32 is in contact with the n-type current spreading region 3 at the inner wall of the second trench 31. The conductive layer 32 and the n-type current spreading region 3 form a Schottky junction 33 along the side wall of the second trench 31. An end of the conductive layer 32 toward the source may protrude outwardly from the second trench 31.

As described, the first p$^+$-type region 6a underlies the bottom of the second trench 31, whereby the Schottky junction 33 is formed only at the side wall of the second trench 31. Therefore, Schottky characteristics of the trench-type SBD 22 are determined by only a Schottky barrier height that is based on one plane orientation (plane orientation of the side wall of the second trench 31). In other words, a part along the bottom (or also including the bottom corner part) of the second trench 31 is an inactive region in which the trench-type SBD 22 is not formed.

One unit cell of the trench-type SBD 22 is constituted by the Schottky junction 33 formed at the side wall of one second trench 31. Unit cells of the trench-type SBD 22 extend along the first direction X along which the second trench 31 extends in a striped shape. A mathematical area (surface area of the Schottky junction 33) of the unit cell of the trench-type SBD 22 may be adjusted by the depth of the second trench 31 and a length (length of the second trench 31 along a length direction (the first direction X)) of the second trench 31 along the direction in which the second trench 31 extends in the striped shape.

The unit cells of the trench-gate-type MOSFET 21 and the unit cells of the trench-type SBD 22 (i.e., the first and the second trenches 7, 31) are disposed so as to satisfy the following two conditions (hereinafter, first and second conditions).

The first condition is that, in a predetermined region (hereinafter, MOS cell region (second region)) C' between adjacent unit cells of the trench-type SBDs 22 (i.e., between adjacent second trenches 31), at least one unit cell of the trench-gate-type MOSFET 21 is provided. The MOS cell region C' is a region having a width w22 (=w21/2) that is a half of a width w21 of a region (first region) C that, in between adjacent second trenches 31, is from an end of the first p$^+$-type region 6a underlying the bottom of the first trench 7 that is disposed nearest one of the adjacent second trenches 31, the end that is nearest the one of the adjacent second trenches 31, to an end of the first p$^+$-type region 6a underlying the bottom of the first trench 7 disposed nearest the other of the adjacent second trenches 31, the end that is nearest the other of the adjacent second trenches 31.

In other words, between adjacent unit cells of the trench-type SBDs 22, two of the MOS cell regions C' are present. In these two MOS cell regions C', respectively, at least one unit cell of the trench-gate-type MOSFET 21 is disposed.

Figure 11:
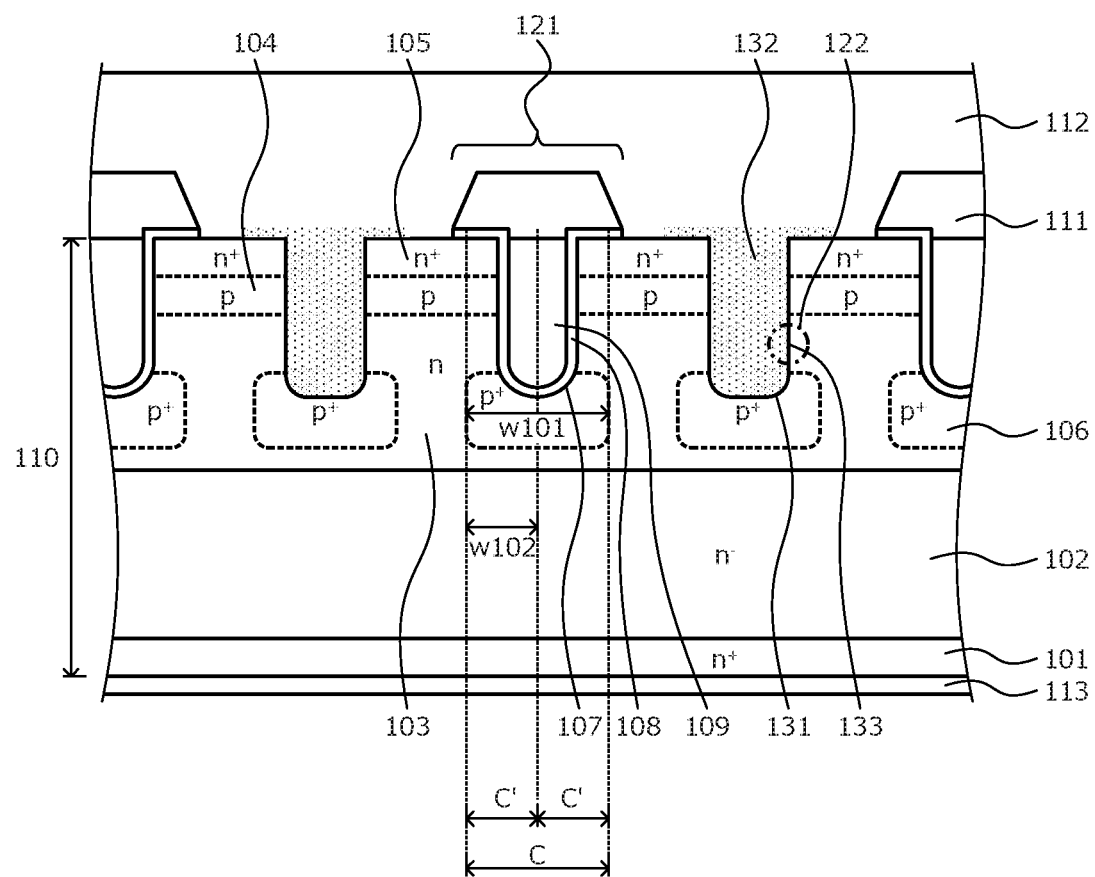
FIG. 11 is a cross-sectional view of a structure of a conventional semiconductor device.
Figure 12:
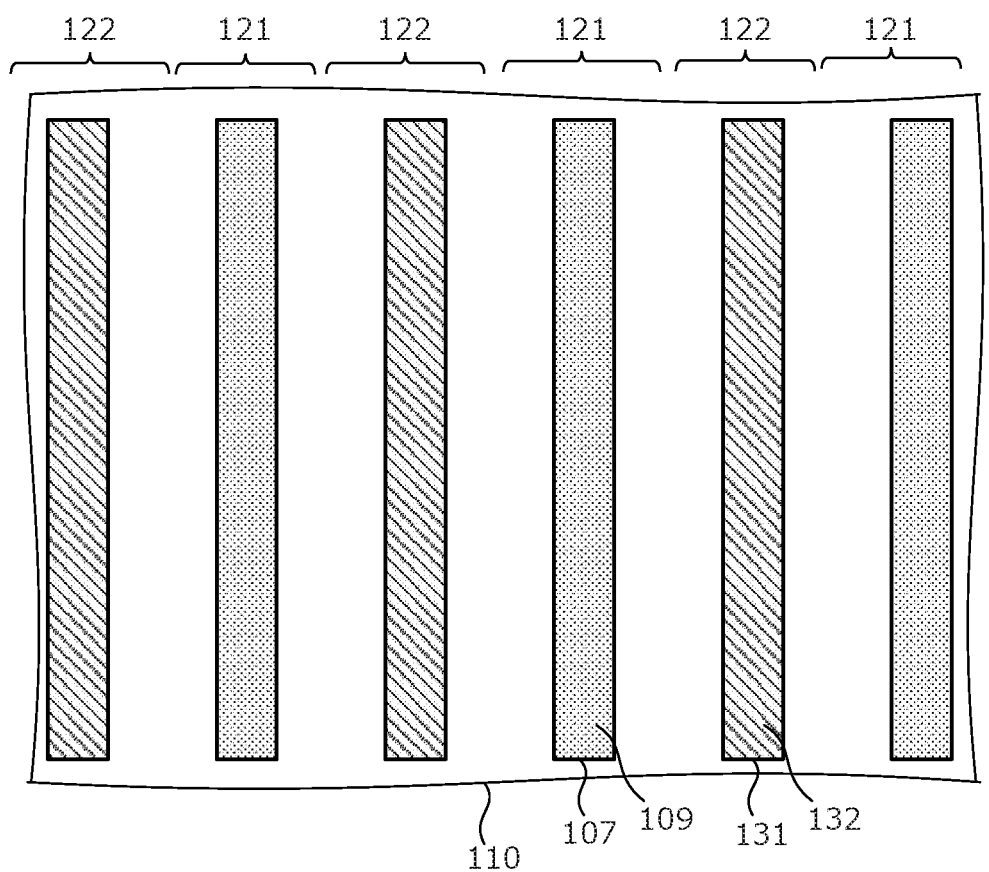
FIG. 12 is a plan view of a layout as viewed from a front surface of a semiconductor substrate depicted in FIG. 11.

Therefore, in the semiconductor substrate 10 in which the trench-gate-type MOSFET 21 is provided, unit cells of the trench-type SBD 22 are disposed fewer in number, whereby the number of unit cells of the trench-type SBD 22 is less than that in the conventional structure (refer to FIGS. 11, 12).

In the conventional structure, a width w102 of the MOS cell region C' is narrow and is, for example, about 0.3 μm to 1.0 μm, which is about a half of a width w01 of the first p$^+$-type region 106 (w102=w101/2). Further, in each MOS cell region C' between adjacent unit cells of the trench-type SBD 122, only one half of a unit cell of the trench-gate-type MOSFET 121 is disposed. On the other hand, in the present embodiment of the invention, between adjacent unit cells of the trench-type SBD 22, at least two unit cells of the trench-gate-type MOSFET 21 are disposed. Therefore, density (density of the first trench 7 (gate trench)) of the trench-gate-type MOSFET 21 in the semiconductor substrate 10 may be increased.

FIGS. 1, 2, and 3 depict a case in which in each of the MOS cell regions C' between adjacent unit cells of the trench-type SBD 22, one unit cell of the trench-gate-type MOSFET 21 is disposed. In other words, FIG. 1 depicts a state, as viewed from the front surface of the semiconductor substrate 10, in which the first and the second trenches 7, 31 are disposed in a striped shape, where every two unit cells of the trench-gate-type MOSFET 21 (every two first trenches 7), one unit cell of the trench-type SBD 22 is disposed (a single second trench 31 is disposed).

In each of the MOS cell regions C' between the adjacent unit cells of the trench-type SBD 22, a same number of unit cells of the trench-gate-type MOSFET 21 may be disposed. A reason for this is that when the number of unit cells of the trench-gate-type MOSFET 21 is reduced by one of the MOS cell regions C' between adjacent unit cells of the trench-type SBD 22, the ON resistance increases; and when the number of unit cells of the trench-gate-type MOSFET 21 is increased, the degree of process difficulty increases. Further, the widths w1 of all of the first p$^+$-type regions 6a disposed in the same MOS cell region C' may be equal. A reason for this is that when the width w1 of any of the first p$^+$-type regions 6a disposed in the same MOS cell region C' is increased, parasitic resistance increases; and when the width w1 of any of the first p$^+$-type regions 6a is reduced, the breakdown voltage and avalanche capability decrease.

The second condition is that a sum Σw1 of the widths w1 of all of the first p$^+$-type regions 6a disposed in a single MOS cell region C' is, for example, in a range of about 2 μm to 8 μm. When the trench-type SBD 22 is ON, the forward current of the trench-type SBD 22 flows from the conductive layer 32, through a part of the n-type current spreading region 3 between adjacent first p$^+$-type regions 6a, to a part 2a (refer to FIG. 4) of the n$^-$-type drift region 2 (or the n-type current spreading region 3) directly below (the drain side of) the first p$^+$-type region 6a. Therefore, the part 2a has a length (=the width w1 of all of the first p$^+$-type regions 6a disposed in a single MOS cell region C') that becomes a resistor and a resistance value of the part 2a adversely affects the ON resistance of the trench-type SBD 22. An upper limit of the second condition suppresses adverse effects on the ON resistance on the trench-type SBD 22 caused by the resistance value of the part 2a and as described hereinafter, is within a permissible range for turning ON the trench-type SBD 22 sooner than a parasitic pn diode of the trench-gate-type MOSFET 21. A lower limit of the second condition is the same as an upper limit of a range of the width w1 of a single first p$^+$-type region 6a.

Figure 4:
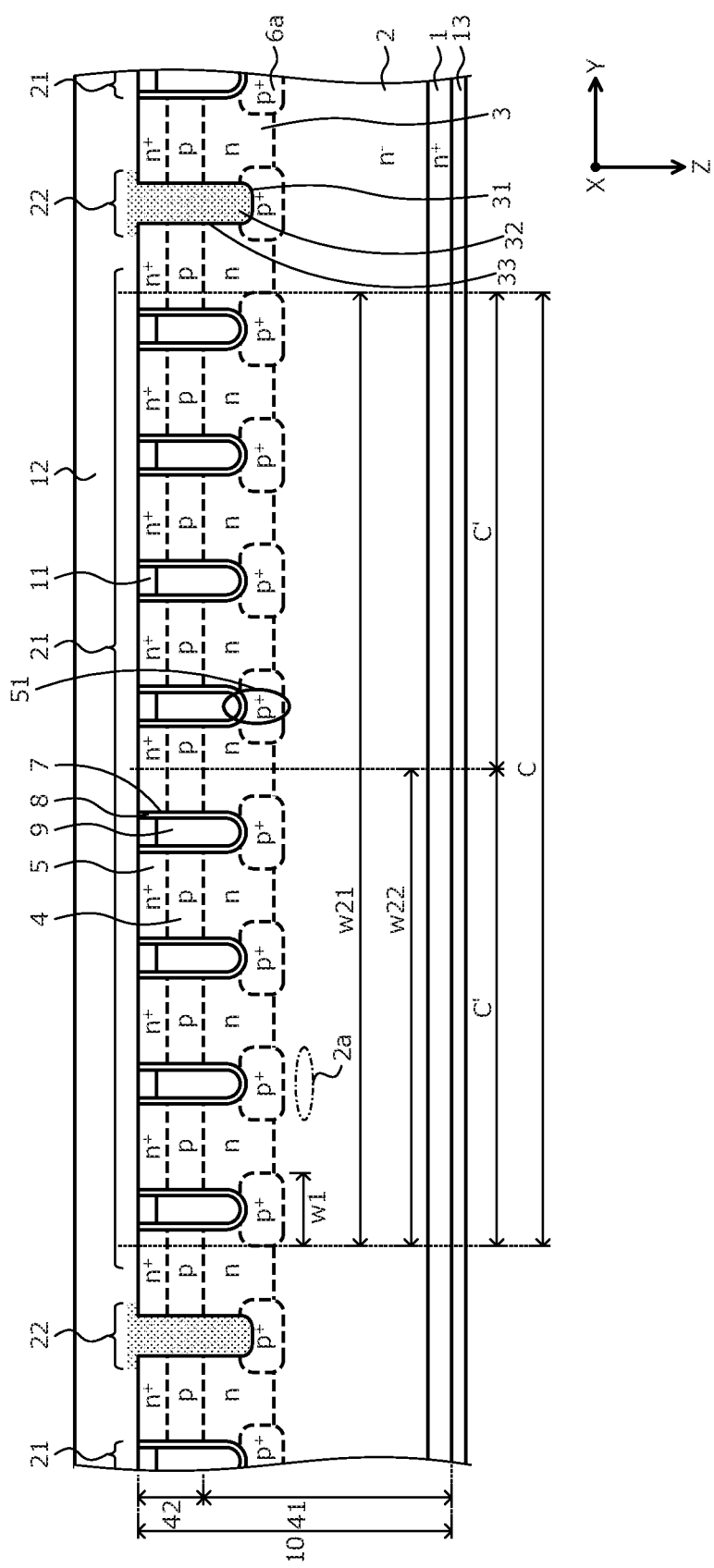
FIG. 4 is a cross-sectional view of another example of a structure of the semiconductor device according to the first embodiment.

For example, as an another example of the semiconductor device according to the first embodiment, a case in which four unit cells of the trench-gate-type MOSFET 21 are disposed in each of the MOS cell regions C' between adjacent unit cells of the trench-type SBD 22 is depicted in FIG. 4. FIG. 4 is a cross-sectional view of another example of a structure of the semiconductor device according to the first embodiment. In the example depicted in FIG. 4, the sum Σw1 of the widths w1 of the four first p$^+$-type regions 6a suffices to be within the range above (i.e., 2 μm≤4×w1≤8 μm). The width w1 of the first p$^+$-type region 6a may be, for example, within a range of about 0.6 μm to 2.0 μm.

In the p-type silicon carbide layer 42, the n$^+$-type source region 5 and the p$^{++}$-type contact region (not depicted) are each selectively provided in all of the mesa regions so as to be in contact with each other. The n$^+$-type source region 5 is disposed so as to be in contact with the first trench 7 and to oppose the gate electrode 9, across the gate insulating film 8 at the side wall of the first trench 7. Further, the n$^+$-type source region 5 is disposed so as to be in contact with the second trench 31, and at the side wall of the second trench 31 is in contact with the conductive layer 32. A part of the p-type silicon carbide layer 42 other than the n$^+$-type source region 5 and the p$^{++}$-type contact region is the p-type base region 4.

The gate electrode 9 is drawn to the front surface of the semiconductor substrate 10 at a part not depicted and is electrically connected to a gate electrode pad (not depicted). An interlayer insulating film 11 covers the gate electrode 9. The interlayer insulating film 11 may be provided on the gate electrode 9 in the first trench 7. Disposal of the interlayer insulating film 11 in the first trench 7 enables the cell pitch of the trench-gate-type MOSFET 21 to be further reduced.

The source electrode 12 is in contact with and electrically connected to the n$^+$-type source region 5, the p$^{++}$-type contact region, and the conductive layer 32. The source electrode 12 is electrically insulated from the gate electrode 9 by the interlayer insulating film 11. The source electrode 12, for example, further serves as the source electrode pad. At the rear surface (a rear surface of the n$^+$-type starting substrate 1 constituting an n$^+$-type drain region) of the semiconductor substrate 10, the drain electrode 13 is provided.

Operation of the semiconductor device according to the first embodiment will be described. During forward biasing of the parasitic pn diode constituted by the pn junction of the p-type base region 4 and the n-type current spreading region 3 of the trench-gate-type MOSFET 21, the trench-type SBD 22 turns ON sooner than the parasitic pn diode, at a voltage lower than that of the parasitic pn diode of the trench-gate-type MOSFET 21. Therefore, no base current flows through a vertical parasitic npn bipolar transistor (body diode) constituted by the n-type current spreading region 3, the p-type base region 4 and the n$^+$-type source region 5 of the trench-gate-type MOSFET 21 and thus, the parasitic npn bipolar transistor does not operate. Therefore, forward degradation due to the parasitic npn bipolar transistor does not occur. In addition, turn ON loss (reverse recovery loss) due to the parasitic npn bipolar transistor may be reduced.

For the semiconductor device according to the first embodiment, formation of the second trench 31 constituting the trench-type SBD 22 and embedding of the conductive layer 32 in the second trench 31 is performed in a general method of manufacturing a trench-gate-type MOSFET. The second trench 31 may be formed concurrently with the first trench 7, which is a gate trench, or may be formed at a timing different from that of the formation of the first trench 7. The first and the second p$^+$-type regions 6a, 6b, and the p$^+$-type connecting region 6c may be formed by ion implanting a p-type impurity in the n$^-$-type silicon carbide layer 41 formed on the n$^+$-type starting substrate 1 by epitaxial growth. At this time, the n$^-$-type silicon carbide layer 41 may formed by two sessions of epitaxial growth to increase the thickness thereof in steps. In this case, after formation of a first epitaxial growth layer of the n$^-$-type silicon carbide layer 41, the first p$^+$-type region 6a and the p$^+$-type connecting region 6c may be formed and after formation of a second epitaxial growth layer of the n$^-$-type silicon carbide layer 41, the second p$^+$-type region 6b may be formed.

As described, according to the first embodiment, a trench-type SBD is disposed on the same semiconductor substrate (semiconductor chip) as a trench-gate-type MOSFET, thereby enabling suppression of forward characteristics degradation and reduction of reverse recovery loss. Further, according to the first embodiment, a unit cell of the trench-type SBD is disposed for every two or more unit cells of the trench-gate-type MOSFET, thereby enabling density of the trench-gate-type MOSFET in the semiconductor chip to be increased. As a result, increases in the ON resistance may be suppressed as compared to the conventional structure in which a unit cell of the trench-gate-type MOSFET and a unit cell of the trench-type SBD are alternately disposed. Therefore, reduction of the ON resistance, suppression of forward characteristics degradation, and reduction of the reverse recovery loss may be concurrently achieved.

Figure 5:
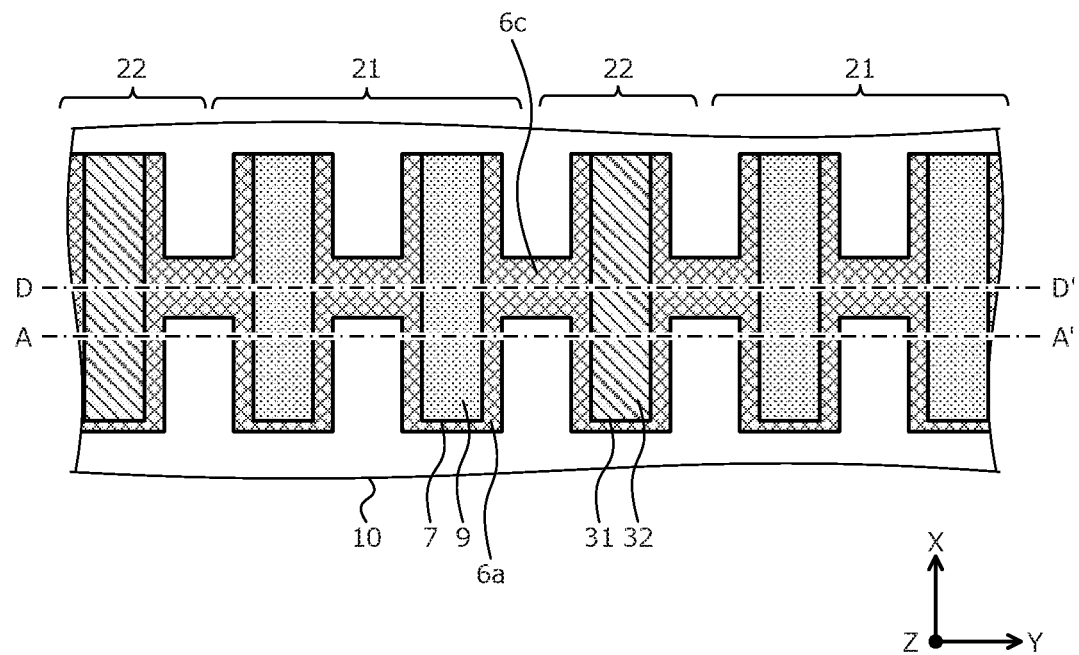
FIG. 5 is a plan view of a planar layout of the semiconductor device according to a second embodiment.
Figure 6:
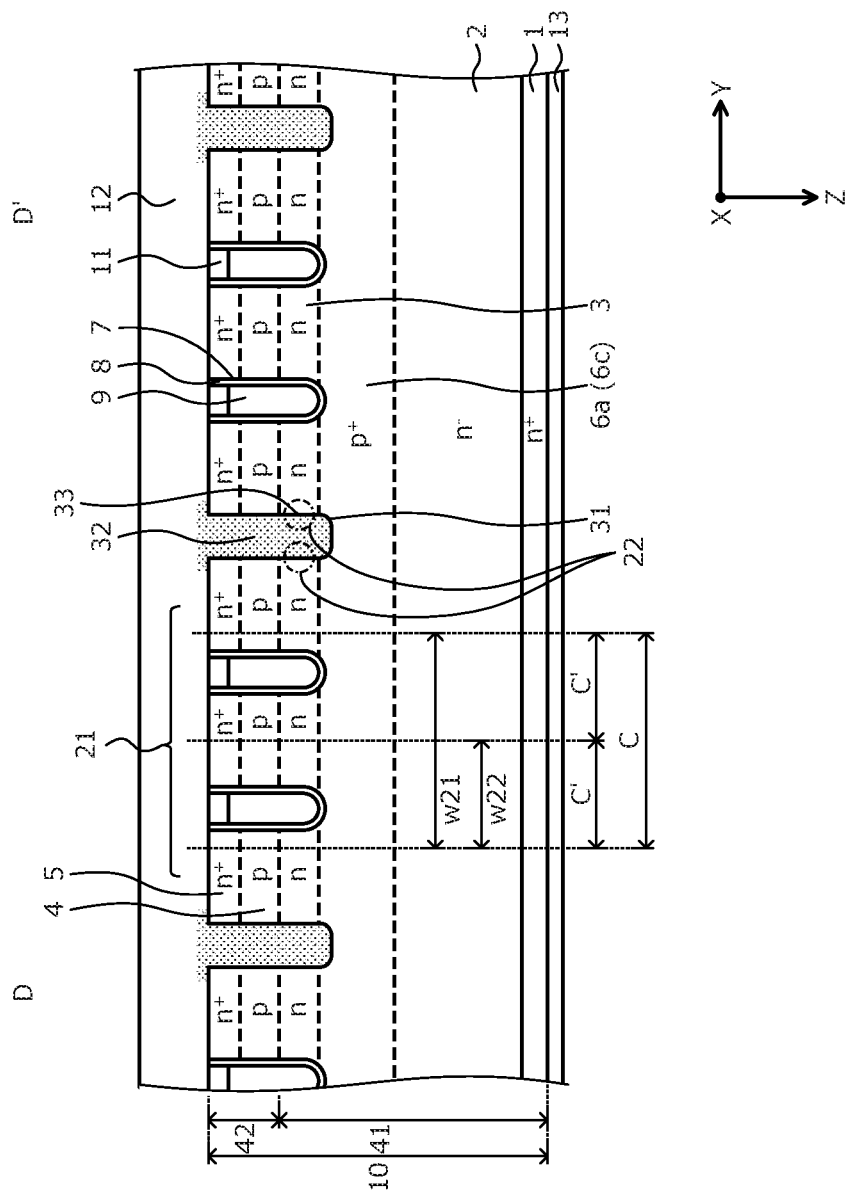
FIG. 6 is a cross-sectional view at cutting line D-D' in FIG. 5.

A structure of the semiconductor device according to a second embodiment will be described. FIG. 5 is a plan view of a planar layout of the semiconductor device according to the second embodiment. FIG. 6 is a cross-sectional view at cutting line D-D' depicted in FIG. 5. A cross-sectional view of the structure at cutting line A-A' in FIG. 5 is identical to that depicted in FIG. 2. The semiconductor device according to the second embodiment differs from the semiconductor device according to the first embodiment in that the second p$^+$-type regions are not provided. In other words, the n-type current spreading region 3 is between the p$^+$-type connecting region 6c of the first p$^+$-type regions 6a and the p-type silicon carbide layer 42 (the p-type base region 4).

As described, according to the second embodiment, effects similar to those of the first embodiment may be obtained. According to the second embodiment, the surface area of the channel region increases, enabling current capability of the trench-gate-type MOSFET to be improved.

Figure 7:
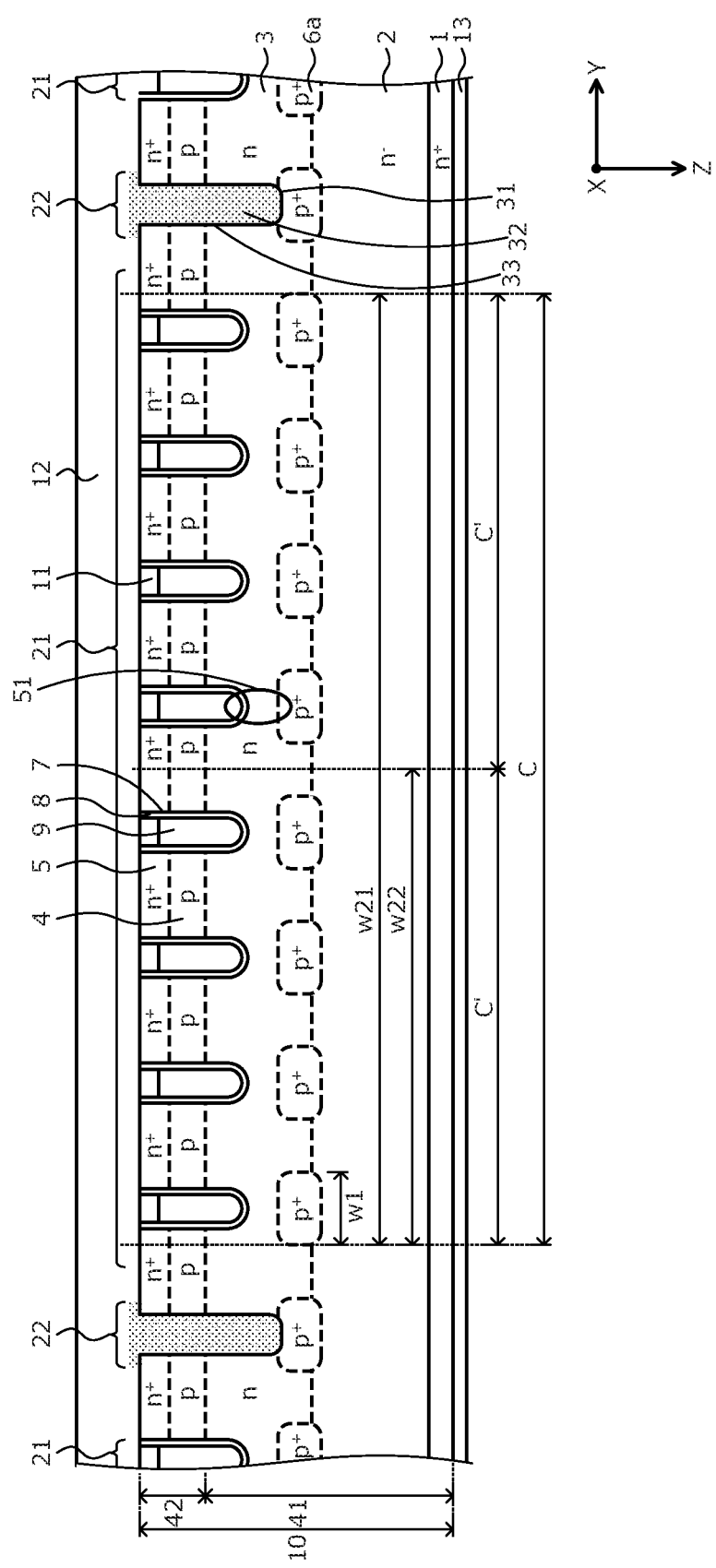
FIG. 7 is a cross-sectional view of a structure of the semiconductor device according to a third embodiment.

A structure of the semiconductor device according to a third embodiment will be described. FIG. 7 is a cross-sectional view of a structure of the semiconductor device according to the third embodiment. The semiconductor device according to the third embodiment differs from the semiconductor device according to the first embodiment in that the first trenches 7 oppose the first p$^+$-type regions 6a, across the n-type current spreading region 3 in the depth direction Z. In other words, the first p$^+$-type regions 6a are disposed separated from the first trenches 7. The second trenches 31 may be provided at a depth deeper than that of the first trenches 7, reaching the first p$^+$-type regions 6a from the substrate front surface.

In the third embodiment, forward current of the trench-type SBD 22 when the trench-type SBD 22 is ON, flows from the conductive layer 32, to a part 51 of the n-type current spreading region 3 between the first p$^+$-type region 6a and the bottom of the first trench 7. In other words, the forward current of the trench-type SBD 22 does not flow to a part of the n$^-$-type drift region 2 directly beneath the first p$^+$-type region 6a. Therefore, the ON resistance of the trench-type SBD 22 is not adversely affected by the resistance value of the part of the n$^-$-type drift region 2 directly beneath (drain side of) the first p$^+$-type region 6a. Therefore, in designing the arrangement of the unit cell of the trench-gate-type MOSFET 21 and the unit cell of the trench-type SBD 22, the constraint of the second condition above is eliminated.

The third embodiment may be applied to the second embodiment.

As described, according to the third embodiment, effects similar to those of the first and the second embodiments may be obtained. Further, according to the third embodiment, the first p$^+$-type region is disposed separated from the gate trench (first trench), whereby the degree of freedom of the arrangement of the unit cell of the trench-gate-type MOSFET 21 and the unit cell of the trench-type SBD 22 increases.

Figure 8:
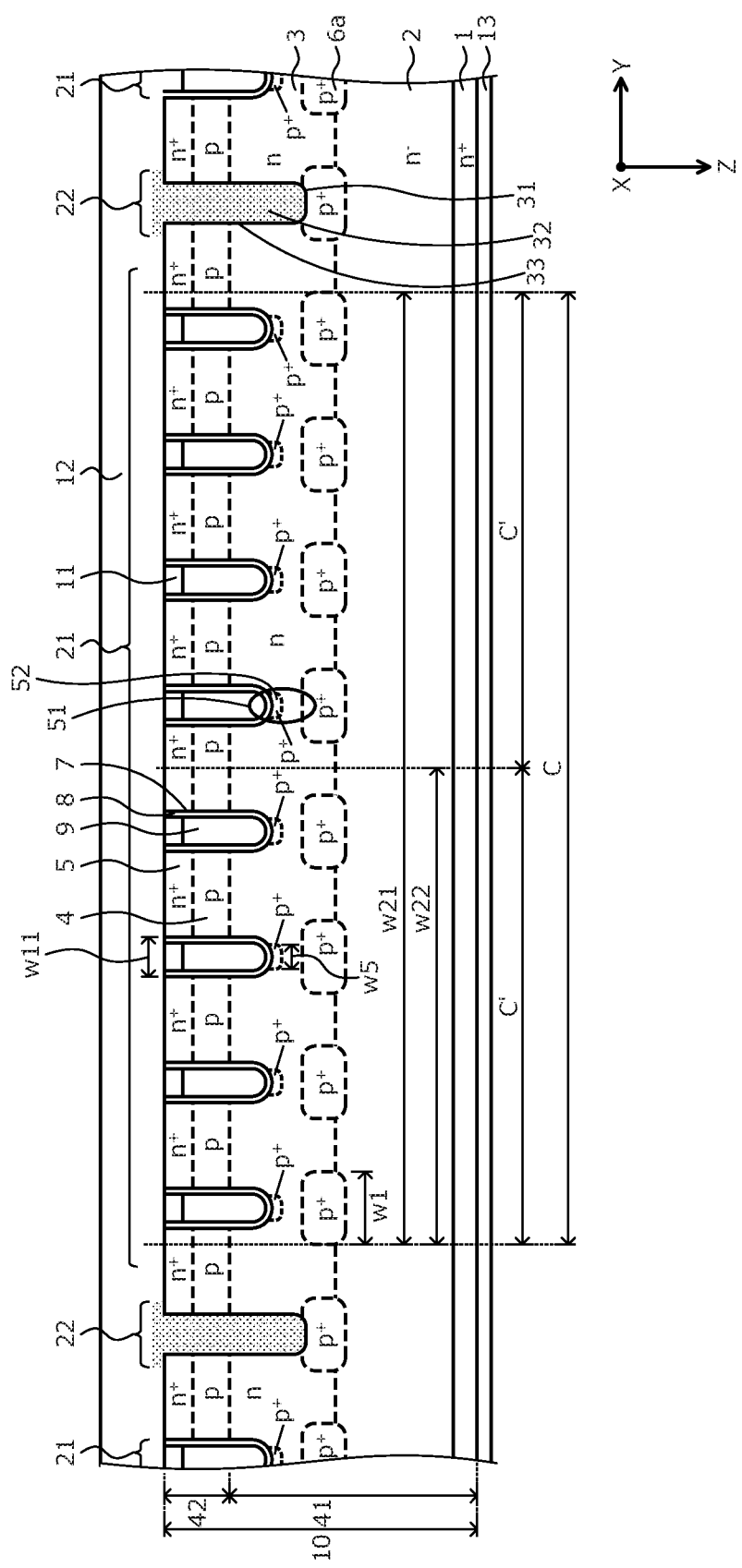
FIG. 8 is a cross-sectional view of the semiconductor device according to a fourth embodiment.

A structure of the semiconductor device according to a fourth embodiment will be described. FIG. 8 is a cross-sectional view of the semiconductor device according to the fourth embodiment. The semiconductor device according to the fourth embodiment differs from the semiconductor device according to the third embodiment in that between the bottoms of the first trenches 7 and the first p$^+$-type regions 6a, p$^+$-type regions (fourth semiconductor regions) 52 are provided separated from the first p$^+$-type regions 6a.

The p$^+$-type regions 52 is in contact with the bottom of the first trench 7 and opposes the gate electrode 9, across the gate insulating film 8 at the bottom of the first trench 7. Further, a part of the p$^+$-type region 52 other than a part in contact with the gate insulating film 8 is covered by the n-type current spreading region 3. The p$^+$-type region 52 has a width w5 that is narrower than the width w11 of the first trench 7.

The fourth embodiment may be applied to the second embodiment.

As described, according to the fourth embodiment, effects similar to those of the first and the second embodiments may be obtained. Further, according to the fourth embodiment, between the bottom of the first trench and the first p$^+$-type region, the p$^+$-type region is provided separated from the first p$^+$-type region, thereby enabling feedback capacitance (capacitance between the gate and the drain) to be reduced.

Figure 9:
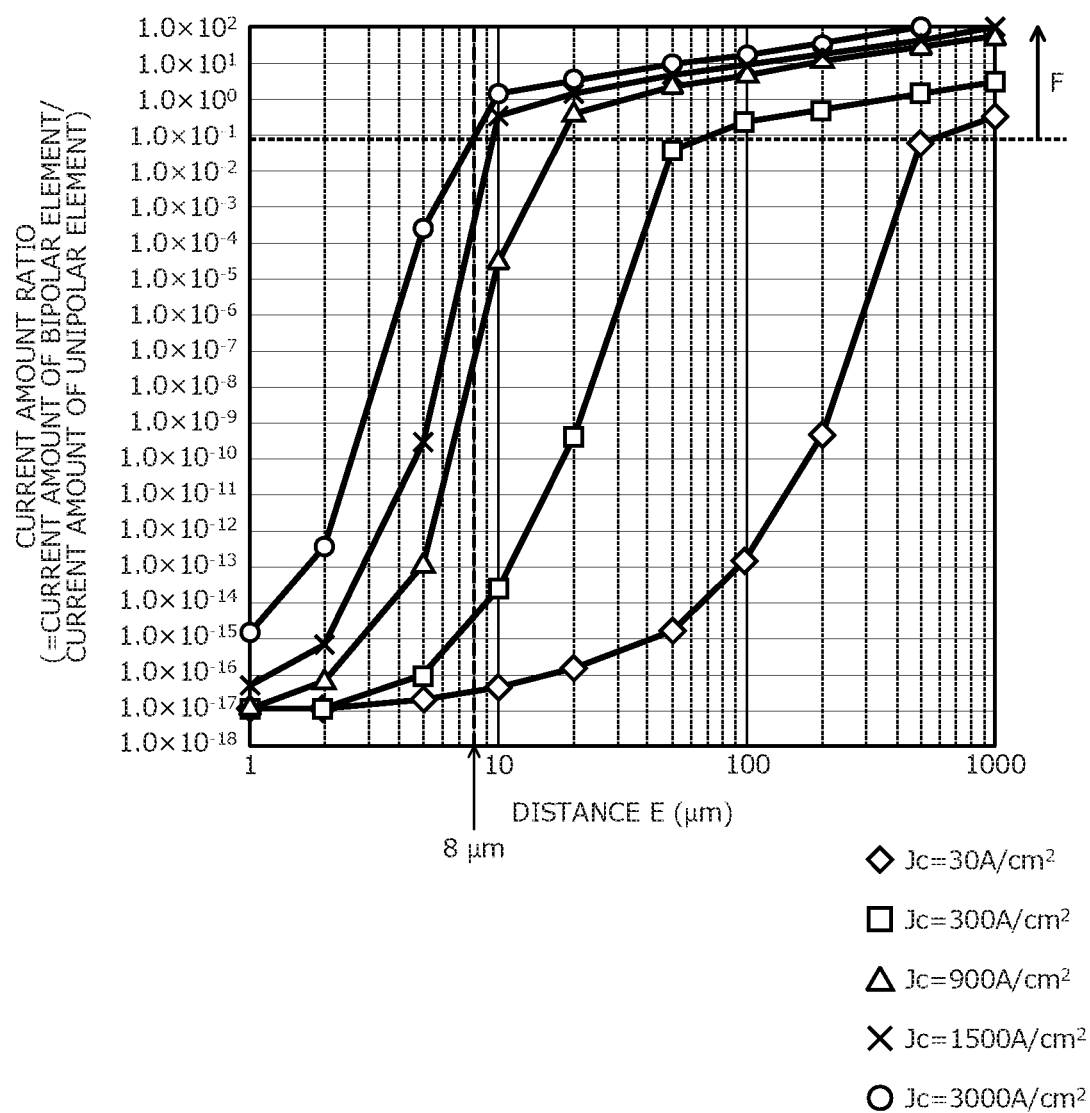
FIG. 9 is a characteristics diagram depicting a relationship of bipolar current and distance between a unipolar element and a p-intrinsic-n (pin) diode disposed on a single semiconductor substrate.

The upper limit of the second condition above was verified. FIG. 9 is a characteristics diagram depicting a relationship of bipolar current and distance between a unipolar element and a p-intrinsic-n (pin) diode disposed on a single semiconductor substrate. In FIG. 9, a horizontal axis represents distance between a pin diode 60a and a unipolar element 60b in FIG. 10. In FIG. 9, a vertical axis represents a current amount ratio (=current amount of the bipolar element/current amount of the unipolar element) of the current amount of a bipolar element (not depicted) disposed in a semiconductor substrate 65, to the current amount of the unipolar element 60b. The current amount ratio was a range F of $1\times10^{-1}$ or greater, which means that bipolar current is flowing.

Figure 10:
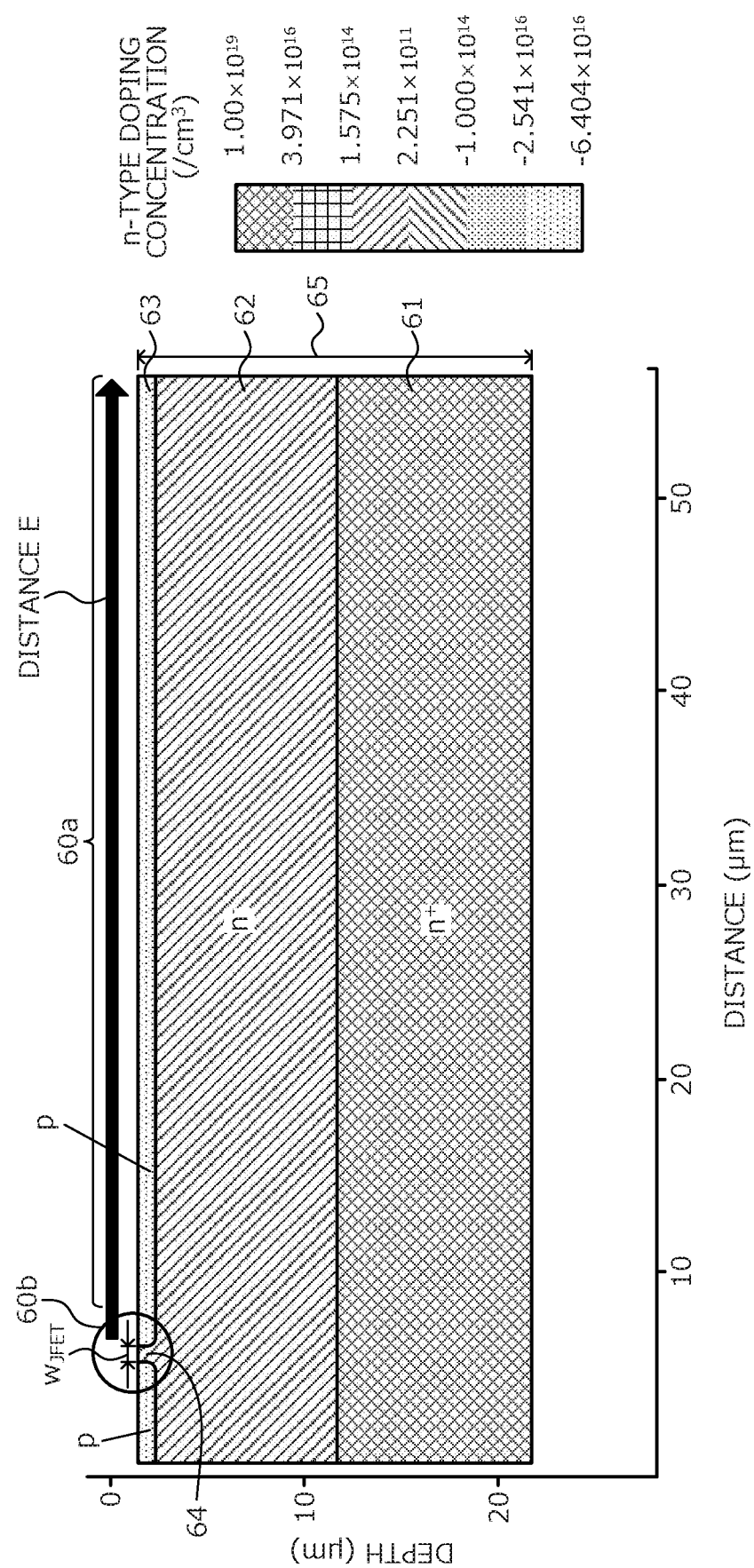
FIG. 10 is a cross-sectional view of a sample used in a verification depicted in FIG. 9.

FIG. 10 is a cross-sectional view of a sample used in the verification depicted in FIG. 9. The sample depicted in FIG. 10 includes the unipolar element 60b built into the same semiconductor substrate 65 as the bipolar element (not depicted). The semiconductor substrate 65 is a silicon carbide epitaxial substrate in which an n$^-$-type layer 62 was formed by epitaxial growth on an n$^+$-type starting substrate 61 that contains silicon carbide. In a surface layer (surface layer on a front surface of the semiconductor substrate 65) of the n$^-$-type layer 62 on a first side of the n$^-$-type layer 62, opposite a second side of the n⁻-type layer 62 facing toward the n⁺-type starting substrate 61, two p-type regions 63 were selectively formed separated from each other. A width $w_{JFET}$ of a part (hereinafter, JFET region) 64 sandwiched by the p-type region 63 was 1.0 μm.

The non-depicted bipolar element disposed in the semiconductor substrate 65 is assumed as the vertical parasitic npn bipolar transistor (body diode) constituted by the n-type current spreading region 3, the p-type base region 4, and the n⁺-type source region 5 of the trench-gate-type MOSFET 21 of the present invention. The pin diode 60a formed by pn junctions of the p-type region 63 with the n⁻-type layer 62 and the n⁺-type starting substrate 61 is assumed as the parasitic pn diode of the present invention and formed by the pn junction of the p-type base region 4 and the n-type current spreading region 3 of the trench-gate-type MOSFET 21. The unipolar element 60b constituted by a JFET region 64 and a conductive layer (not depicted) is assumed as the trench-type SBD 22 of the present invention.

In the sample depicted in FIG. 10, a relationship of a distance E of the pin diode 60a and the unipolar element 60b and the ratio of the current amount of the bipolar element disposed in the semiconductor substrate 65, to the current amount of the unipolar element 60b, when the bipolar element was turned ON is depicted in FIG. 9. The distance E of the pin diode 60a and the unipolar element 60b corresponds to the second condition which is the sum Σw1 of the width w1 of all of the first p⁺-type regions 6a disposed in a single MOS cell region C'. FIG. 9 depicts results when a critical current density Jc of the bipolar element is varied and the ratio of the current amount of the bipolar element disposed in the semiconductor substrate 65, to the current amount of the unipolar element 60b is measured.

The results depicted in FIG. 9 confirm that the greater the distance E of the pin diode 60a and the unipolar element 60b is, the easier the bipolar current flows. A reason for this is that the magnitude of the length of the distance E contributes to the resistance of the n⁻-type layer 62, and the ON resistance of the unipolar element 60b increases. While this appears significantly the greater the critical current density Jc of the bipolar element is, the results confirm that even when the critical current density Jc of the bipolar element is increased, for example, to 3000 A/cm², provided the distance E of the pin diode 60a and the unipolar element 60b is 8 μm or less, bipolar current does not flow. Therefore, in the present invention, when the sum Σw1 of the width w1 of all of the first p⁺-type regions 6a disposed in a single MOS cell region C' is 8 μm or less, the bipolar current does not flow.

In the embodiments of the present invention, various modifications are possible within a range not departing from the spirit of the invention. For example, dimensions, impurity concentrations, etc. of regions may be variously set according to required specifications. Further, in the embodiments above, while a case in which a silicon carbide epitaxial substrate is used in which a silicon carbide layer is formed by epitaxial growth on a starting substrate that contains silicon carbide has been described as an example, regions constituting the semiconductor device according to the present invention, for example, may be formed in the silicon carbide substrate by ion implantation, etc. Further, the present invention achieves similar effects even when applied to a wide bandgap semiconductor material other than silicon carbide (for example, gallium (Ga) or the like). The present invention is similarly implemented when the conductivity types (n-type, p-type) are reversed.

According to the embodiments of the present invention, forward characteristics degradation due to the Schottky barrier diode embedded in the second trench may be suppressed and reverse recovery loss may be reduced. Further, according to the embodiments of the present invention, two or more of the first trenches (gate trench) are disposed between adjacent second trenches, thereby enabling the MOS gate density in the semiconductor substrate (semiconductor chip) to be increased and increases in the ON resistance to be suppressed.

The semiconductor device of the present invention achieves effects in that reduction of the ON resistance, suppression of forward characteristics degradation, and reduction of reverse recovery loss may be realized.

As described, the semiconductor device according to the present invention is useful for MOS-type semiconductor devices having a trench gate structure.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
   a semiconductor substrate made of a semiconductor material having a bandgap that is wider than that of silicon;
   a first semiconductor layer of a first conductivity type and containing a semiconductor material having a bandgap that is wider than that of silicon, the first semiconductor layer provided on a front surface of the semiconductor substrate;
   a second semiconductor layer of a second conductivity type and containing a semiconductor material having a bandgap that is wider than that of silicon, the second semiconductor layer provided on a first side of the first semiconductor layer, opposite a second side of the first semiconductor layer facing the semiconductor substrate;
   a first semiconductor region of the first conductivity type, selectively provided in the second semiconductor layer;
   a plurality of trenches penetrating the first semiconductor region and the second semiconductor layer, and reaching the first semiconductor layer;
   a gate electrode provided on a gate insulating film in first trenches of the plurality of trenches;
   a conductive layer in second trenches of the plurality of trenches, different from the first trenches;
   second semiconductor regions of the second conductivity type selectively provided in the first semiconductor layer, separated from the second semiconductor layer and respectively opposing the first trenches in a depth direction;
   third semiconductor regions of the second conductivity type selectively provided in the first semiconductor layer, separated from the second semiconductor layer and respectively underlying bottoms of the second trenches;
   a first electrode electrically connected with the second semiconductor layer, the first semiconductor region, the second semiconductor region, the third semiconductor region, and the conductive layer;
   a second electrode provided at a rear surface of the semiconductor substrate; and
   a Schottky barrier diode constituted by a Schottky junction of the conductive layer and the first semiconductor layer, wherein at least two of the first trenches are provided between a pair of the second trenches that are adjacent to each other.

2. The semiconductor device according to claim 1, wherein between the pair of the second trenches, a first region is from an end of a first second-semiconductor-region of the second semiconductor regions and nearest a first second-trench of the pair of the second trenches, to an end of a second second-semiconductor-region of the second semiconductor regions and nearest a second second-trench of the pair of the second trenches, the end of the first second-semiconductor-region being an end nearest the first second-trench while the end of the second second-semiconductor-region being an end nearest the second second-trench, and a second region between the pair of the second trenches has a width that is a half of a width of the first region, and at least one of the first trenches is disposed in the second region.

3. The semiconductor device according to claim 2, wherein a sum of the width of all the second semiconductor regions disposed in second region is in a range from 2 µm to 8 µm.

4. The semiconductor device according to claim 1, wherein the second semiconductor regions underlie bottoms of the first trenches.

5. The semiconductor device according to claim 1, wherein the second semiconductor regions are disposed separated from the first trenches.

6. The semiconductor device according to claim 5, further comprising fourth semiconductor regions of the second conductivity type provided between the first trenches and the second semiconductor regions, separated from the second semiconductor regions and respectively underlying bottoms of the first trenches.

7. The semiconductor device according to claim 1, wherein the plurality of trenches is disposed in a striped layout extending along a direction parallel to the front surface of the semiconductor substrate.

* * * * *